United States Patent
Qu et al.

(10) Patent No.: US 7,697,332 B2
(45) Date of Patent: Apr. 13, 2010

(54) PLACEMENT AND ROUTING OF ECC MEMORY DEVICES FOR IMPROVED SIGNAL TIMING

(75) Inventors: Pingyu Qu, Ottawa (CA); Barrie Patrick Gahan, Braeside (CA)

(73) Assignee: Alcatel Lucent, Paris (FR)

( * ) Notice: Subject to any disclaimer, the term of this patent is extended or adjusted under 35 U.S.C. 154(b) by 175 days.

(21) Appl. No.: 12/000,489

(22) Filed: Dec. 13, 2007

(65) Prior Publication Data

US 2009/0154211 A1 Jun. 18, 2009

(51) Int. Cl.
G11C 16/06 (2006.01)
(52) U.S. Cl. .............................. 365/185.09; 365/185.11; 365/230.05; 365/235
(58) Field of Classification Search .................. 365/51, 365/69, 185.11, 189.08, 185.09, 230.05, 365/235
See application file for complete search history.

(56) References Cited

U.S. PATENT DOCUMENTS

| | | | | |
|---|---|---|---|---|
| 5,604,703 A | * | 2/1997 | Nagashima | 365/200 |
| 6,839,266 B1 | * | 1/2005 | Garrett et al. | 365/69 |
| 7,224,595 B2 | * | 5/2007 | Dreps et al. | 365/63 |
| 7,227,797 B2 | * | 6/2007 | Thayer et al. | 365/201 |

* cited by examiner

*Primary Examiner*—Pho M. Luu
(74) *Attorney, Agent, or Firm*—Kramer & Amado, P.C.

(57) ABSTRACT

A printed circuit board may include a memory controller, a plurality of synchronous data memory devices, each synchronous memory device including at least one data pin and at least one address/command pin, an ECC memory device including at least one ECC data pin and at least one ECC address/command pin, and at least one surface. The plurality of synchronous data memory devices may be arranged around a central location on the at least one surface and each synchronous data memory device may be oriented such that the at least one data pin is further from the memory controller than the at least one address/command pin.

37 Claims, 7 Drawing Sheets

PLACEMENT AND ROUTING OF ECC MEMORY DEVICES FOR IMPROVED SIGNAL TIMING

BACKGROUND OF THE INVENTION

1. Field of the Invention

This invention relates generally to memory for computer systems.

2. Description of Related Art

A number of factors influence the likelihood of failure of Random Access Memory (RAM). Power surges, decay of the chip, and even cosmic rays originating in outer space can cause the data stored in memory to become corrupted. When a memory failure occurs, the byte of data returned from memory in response to a read request is different than the byte of data originally written into memory. In a typical memory chip, these errors go undetected, leading to application or system crashes. For commercial applications in which data integrity is critical, such as web servers, these problems with reliability can result in significant costs to a corporation.

Error Correcting Code (ECC) memory addresses these problems by introducing additional circuitry for testing the accuracy of data as it passes in and out of memory. More specifically, ECC memory stores redundant bits of data and performs additional calculations using these redundant bits to dynamically detect and correct errors.

While ECC memory is an effective means for error detection and correction, the additional circuitry and data bits used to implement ECC memory introduce a number of problems. Primarily, it becomes more difficult to implement synchronous dynamic random access memory (SDRAM) when including error correction circuitry. SDRAM, which includes Double Data Rate (DDR) SDRAM and DDR2 SDRAM, synchronizes with the computer's system bus, so all operations are typically performed within a predetermined time window. If an operation is not performed in the proper time window, a timing violation occurs and often results in a system crash, the very problem ECC memory was designed to avoid. Because ECC memory adds an additional data bit, correctly timing operations and thereby avoiding system crashes becomes more complex. Thus, there is a need for a simple, cost-effective solution for meeting timing requirements when implementing SDRAM with ECC.

The foregoing objects and advantages of the invention are illustrative of those that can be achieved by the various exemplary embodiments and are not intended to be exhaustive or limiting of the possible advantages which can be realized. Thus, these and other objects and advantages of the various exemplary embodiments will be apparent from the description herein or can be learned from practicing the various exemplary embodiments, both as embodied herein or as modified in view of any variation which may be apparent to those skilled in the art. Accordingly, the present invention resides in the novel methods, arrangements, combinations and improvements herein shown and described in various exemplary embodiments.

SUMMARY OF THE INVENTION

There is a need for fulfilling timing requirements when interconnecting multiple DDR2 memory devices with ECC functionality to a controlling application-specific integrated circuit (ASIC) or network processor on a printed circuit board (PCB). There is also a need for managing skew between the data lines (DQ), data line strobes (DQS), clock signals (CLK), and address/command lines (ADDR/CMD) of a memory device to optimize timing results. Furthermore, there is a need for minimizing timing violations by balancing loads on each ADDR/CMD bit.

In light of the present need for a solution for meeting timing requirements when implementing SDRAM with ECC, a brief summary of various exemplary embodiments is presented. Some simplifications and omission may be made in the following summary, which is intended to highlight and introduce some aspects of the various exemplary embodiments, but not to limit its scope. Detailed descriptions of a preferred exemplary embodiment adequate to allow those of ordinary skill in the art to make and use the invention concepts will follow in later sections.

According to the forgoing, various exemplary embodiments minimize the skew between data lines, data line strobes, and address/command lines in a printed circuit board or integrated circuit. Thus, in various exemplary embodiments, data memory devices are arranged equidistant to a central location and oriented such that ADDR/CMD pins are closer to the memory controller than DQ/DQs pins. In various exemplary embodiments, ADDR/CMD signals that go to all RAM are routed through the central location, thereby reducing delay.

Accordingly, in various exemplary embodiments, this arrangement not only improves the skew between DQ and ADDR/CMD, but also makes it easier to balance an odd number of loads on ADDR/CMD signals, thereby achieving better signal integrity and timing. In addition, in various exemplary embodiments, DQ and DQs lines are routed in an indirect route, thereby further decreasing the skew between DQ and ADDR/CMD.

BRIEF DESCRIPTION OF THE DRAWINGS

In order to better understand various exemplary embodiments, reference is made to the accompanying drawings, wherein.

DETAILED DESCRIPTION OF THE PREFERRED EMBODIMENTS OF THE INVENTION

In the detailed description that follows, reference is made to numerous embodiments of a "printed circuit board." It should be understood that, as used herein, "printed circuit board" is not strictly limited to its ordinary meaning. Thus, in various exemplary embodiments, "printed circuit board"

includes, but is not limited to, printed circuit boards, application-specific integrated circuits, hybrid integrated circuits, and other suitable replacements known to those of ordinary skill in the art.

Figure 1:
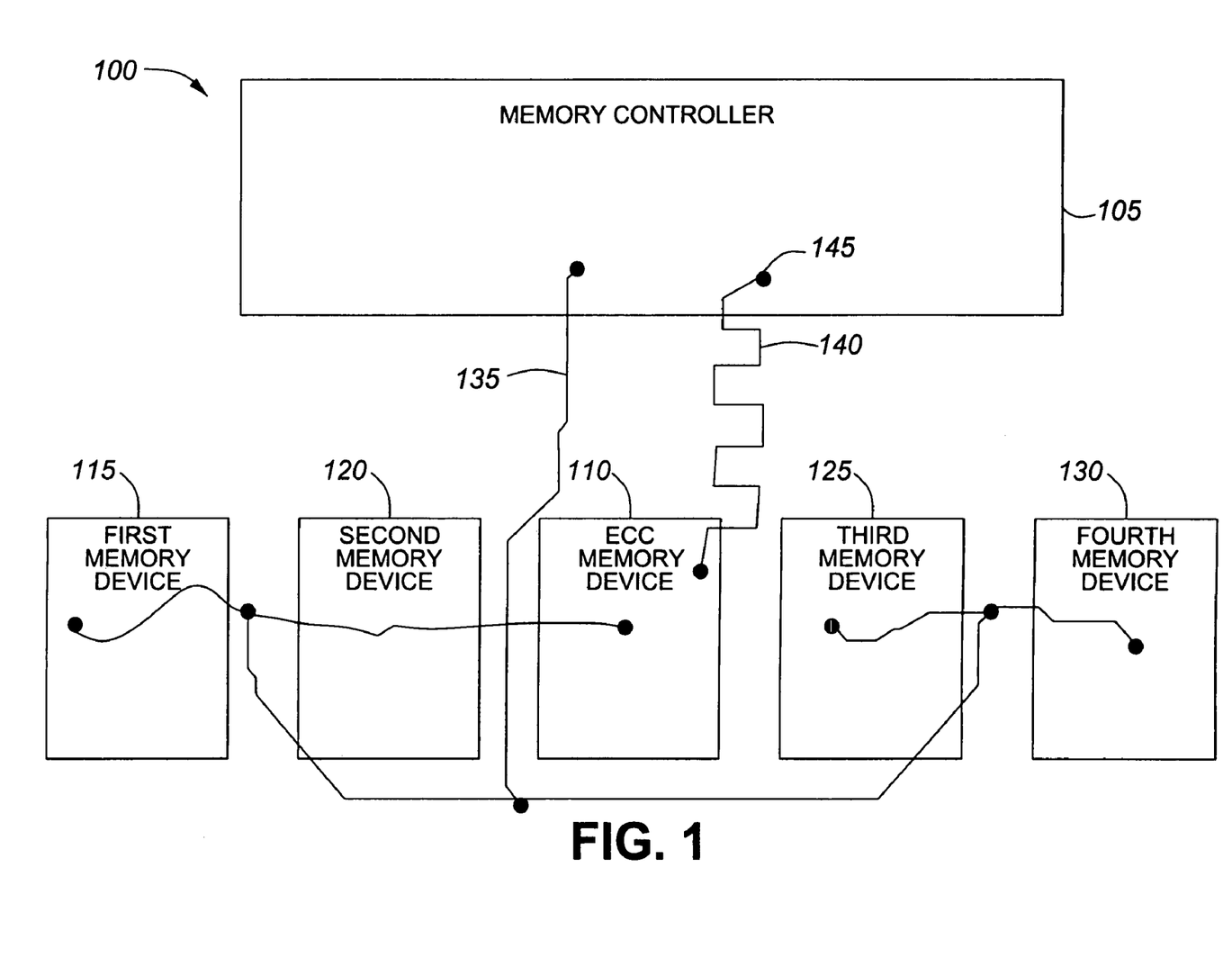
FIG. 1 is a schematic diagram of a first exemplary embodiment of a printed circuit board including four memory devices and an ECC memory device.

Referring now to the drawings, in which like numerals refer to like components or steps, there are disclosed broad aspects of various exemplary embodiments. FIG. 1 is a schematic diagram of a first exemplary embodiment of a printed circuit board 100 including four memory devices 115, 120, 125, 130 and an ECC memory device 110.

Exemplary printed circuit board 100 includes memory controller 105, ECC memory device 110, first memory device 115, second memory device 120, third memory device 125, fourth memory device 130, address/command line 135, and data line 140. It should be apparent that FIG. 1 is a simplified schematic of exemplary printed circuit board 100. Thus, various exemplary embodiments of printed circuit board 100 include numerous other components for implementing the intended functions of the printed circuit board 100.

In various exemplary embodiments, memory controller 105 is a chip that manages the flow of data going to and from memory devices 110, 115, 120, 125, 130. Thus, in various exemplary embodiments, memory controller 105 is embedded in an ASIC or PCB. Moreover, in various exemplary embodiments, memory controller 105 provides timing control between the processor and the memory devices 110, 115, 120, 125, 130. In various exemplary embodiments, memory controller 105 is a network processor.

ECC memory device 110 is a chip that includes special circuitry for testing the accuracy of data as it passes in and out of memory devices 115, 120, 125, 130. Thus, in various exemplary embodiments, ECC memory device 110 receives eight bits of data for every sixty-four bits of data transferred to memory devices 115, 120, 125, 130. Then, in various exemplary embodiments, ECC memory device 110 examines the 8-bit block of data for errors and, when it finds errors, examines the other sixty-four bits of data to perform error correction.

In various exemplary embodiments, first memory device 115, second memory device 120, third memory device 125, and fourth memory device 130 are synchronous memory devices, such as DDR2 memory chips. It should be apparent that, in various exemplary embodiments, exemplary printed circuit board 100 includes four additional memory devices arranged on the opposite face directly opposite memory devices 115, 120, 125, 130. Thus, in this "clamshell" arrangement, the printed circuit board 100 includes a total of eight data memory devices in addition to ECC memory device 110. Furthermore, it should be apparent that, although illustrated with four memory devices, exemplary circuit board 100 may include fewer or additional memory devices in other exemplary embodiments.

In various exemplary embodiments, address/command line 135 transports command signals between memory controller 105 and each of the memory devices 110, 115, 120, 125, 130. Thus, in various exemplary embodiments, address/command line 135 transports a signal containing a memory address and a command, such as read or write.

In various exemplary embodiments, data line 140 is a data line for sending data between memory controller 105 and ECC device 110. As illustrated in FIG. 1, the total length of data line 140 is shorter than other data lines (not shown), as ECC device 110 is closest to the connection point 145 at memory controller 105. It should be apparent that although only one address/command line 135 and one data line 140 are illustrated in FIG. 1, in various exemplary embodiments, each memory device 110, 115, 120, 125, 130 includes a plurality of connection points for address/command lines and data lines, each of which are routed to memory controller 105.

The exemplary arrangement illustrated in FIG. 1 is simple, as all memory devices are aligned in a row in the same orientation. This arrangement, however, suffers from a number of deficiencies. In order to properly time the control signals transmitted over address/command line 135 and the data signals transmitted over data line 140, the length of these lines must be approximately the same. At higher memory interface speeds, such as 533 MHz, this problem is amplified. Accordingly, shorter data lines, such as data line 140 must include a significant amount of meandering to approach the length address/command line 135. Thus, data line 140 is represented in exemplary printed circuit board 100 with many changes of direction. Accordingly, in various exemplary embodiments, data line 140 takes a circuitous route on exemplary printed circuit board 100, thereby occupying a significant amount of space and numerous routing layers.

Figure 2:
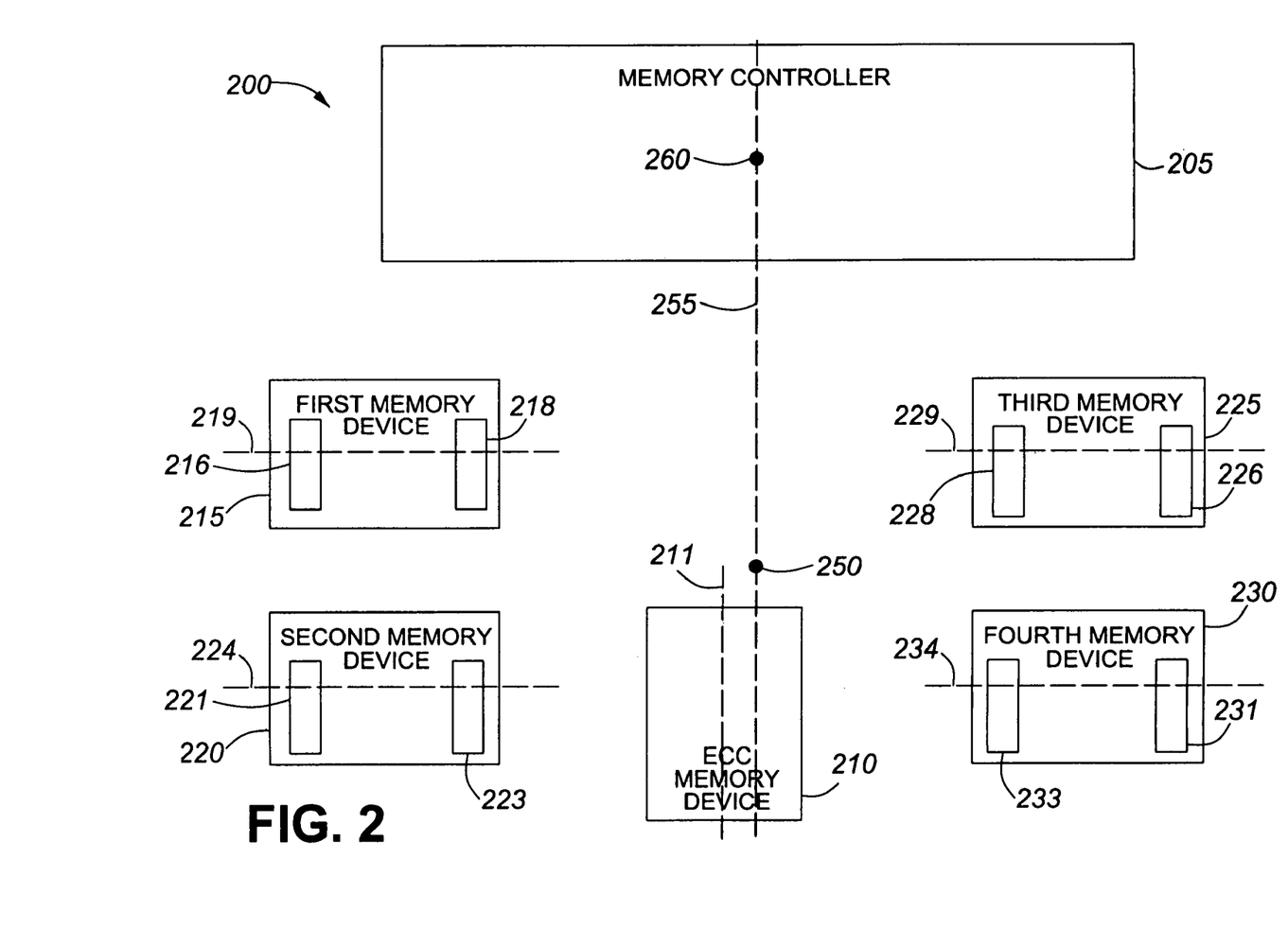
FIG. 2 is a schematic diagram of a second exemplary embodiment of a printed circuit board including four memory devices and an ECC memory device.

FIG. 2 is a schematic diagram of a second exemplary embodiment of a printed circuit board 200 including four memory devices 215, 220, 225, 230 and an ECC memory device 210. Exemplary printed circuit board 200 includes memory controller 205, ECC memory device 210, first memory device 215, data line pin 216, address/command line pin 218, second memory device 220, data line pin 221, address/command line pin 223, third memory device 225, data line pin 226, address/command line pin 228, fourth memory device 230, data line pin 231, and address/command line pin 233. Long axes 211, 219, 224, 229, 234, central location 250, axis 255, and midpoint 260 are also shown for reference.

It should be apparent that, in various exemplary embodiments, memory controller 205 is similar in functionality to memory controller 105, memory devices 215, 220, 225, 230 are similar in functionality to memory devices 115, 120, 125, 130, respectively, and ECC memory device 210 is similar in functionality to ECC memory device 110.

In various exemplary embodiments, skew between data lines, data line strobes, and address/command lines is minimized through optimum placement and topology. Thus, in various exemplary embodiments, memory devices 215, 220, 225, 230 are arranged equidistant to a central location 250, thereby ensuring that the lengths of the lines to each memory device 215, 220, 225, 230 are approximately equal. Accordingly, in various exemplary embodiments, central location 250 is on axis 255, where axis 255 extends through midpoint 260 of memory controller 205. Moreover, in various exemplary embodiments, the plurality of memory devices 215, 220, 225, 230 are arranged symmetrically about axis 255.

In addition, in various exemplary embodiments, memory devices 215, 220, 225, 230 are rotated ninety degrees with respect to the orientation of memory devices 115, 120, 125, 130, respectively, such that data line pins 216, 221, 226, 231 are further away from memory controller 205 than address/command pins 218, 223, 228, 233. Accordingly, in such embodiments, the length of the data lines between memory devices 215, 220, 225, 230 and memory controller 205 is increased, while the length of the address/command lines between memory devices 215, 220, 225, 230 and memory controller 205 is decreased. In addition, in various exemplary embodiments, rotation of memory devices 215, 220, 225, 230 decreases their height, thereby decreasing the difference between the lengths of the data lines.

Furthermore, in various exemplary embodiments, each of the memory devices 215, 220, 225, 230 includes a long axis 219, 224, 229, 234, respectively. Moreover, in various exemplary embodiments, ECC memory device 210 also includes a long axis 211. In various exemplary embodiments, as shown in FIG. 2, the long axis 219, 224, 229, 234 of each of the plurality of memory devices 215, 220, 225, 230 forms an angle of ninety degrees with respect to the long axis 211 of ECC memory device 210.

While FIG. 2 illustrates memory controller 205 in a vertical position with respect to memory devices 210, 215, 220, 225, 230, it should be apparent that, in various exemplary embodiments, the components of printed circuit board 200 are rotated between zero and three-hundred sixty degrees to another orientation. Thus, in various exemplary embodiments, memory controller 205 is positioned in a horizontal position with respect to memory devices 210, 215, 220, 225, 230, such that axis 250 extends horizontally through central location 250.

Although illustrated with four memory devices 215, 220, 225, 230 and one ECC memory device 210, it should be apparent that, in various exemplary embodiments, exemplary printed circuit board 200 includes four additional memory devices arranged on the opposite face directly opposite memory devices 215, 220, 225, 230. Thus, in this "clamshell" arrangement, the printed circuit board 200 includes a total of eight data memory devices in addition to ECC memory device 210. In such embodiments, printed circuit board 200 includes additional address/command pins and data line pins for each added memory device.

Figure 3:
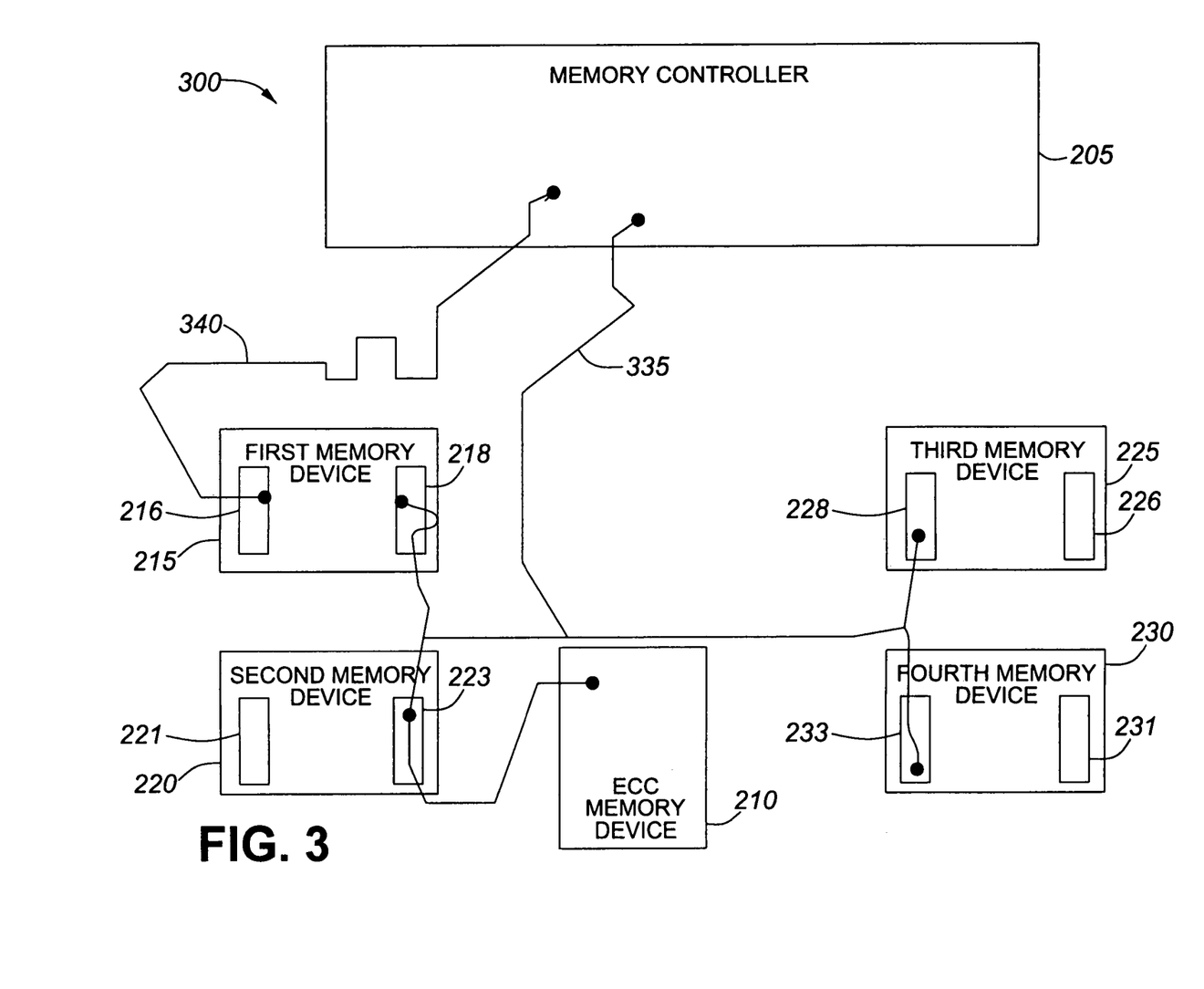
FIG. 3 is a schematic diagram of a third exemplary embodiment of a printed circuit board including four memory devices and an ECC memory device.

FIG. 3 is a schematic diagram of a third exemplary embodiment of a printed circuit board 300 including four memory devices 215, 220, 225, 230 and an ECC memory device 210. It should be apparent that, in various exemplary embodiments, address/command line 335 is similar in functionality to address/command line 135 and data line 340 is similar in functionality to data line 140.

In various exemplary embodiments, data line 340 is the shortest data line in exemplary printed circuit board 300. Thus, in various exemplary embodiments, data line 340 includes some meandering to more closely approximate the length of address/command line 335.

It should be apparent that rotating memory devices 215, 220, 225, 230, as described above in connection with FIG. 2, decreases the difference between the length of address/command line 335 and data line 340, while minimizing the necessity for meandering. Thus, in various exemplary embodiments, data line pin 216, which receives data line 340, is further from memory controller 205 than address/command line pin 218, which receives address/command line 335. Accordingly, in various exemplary embodiments, exemplary printed circuit board 300 minimizes skew between address/command line 335 and data line 340, thereby providing a better timing margin.

Figure 4:
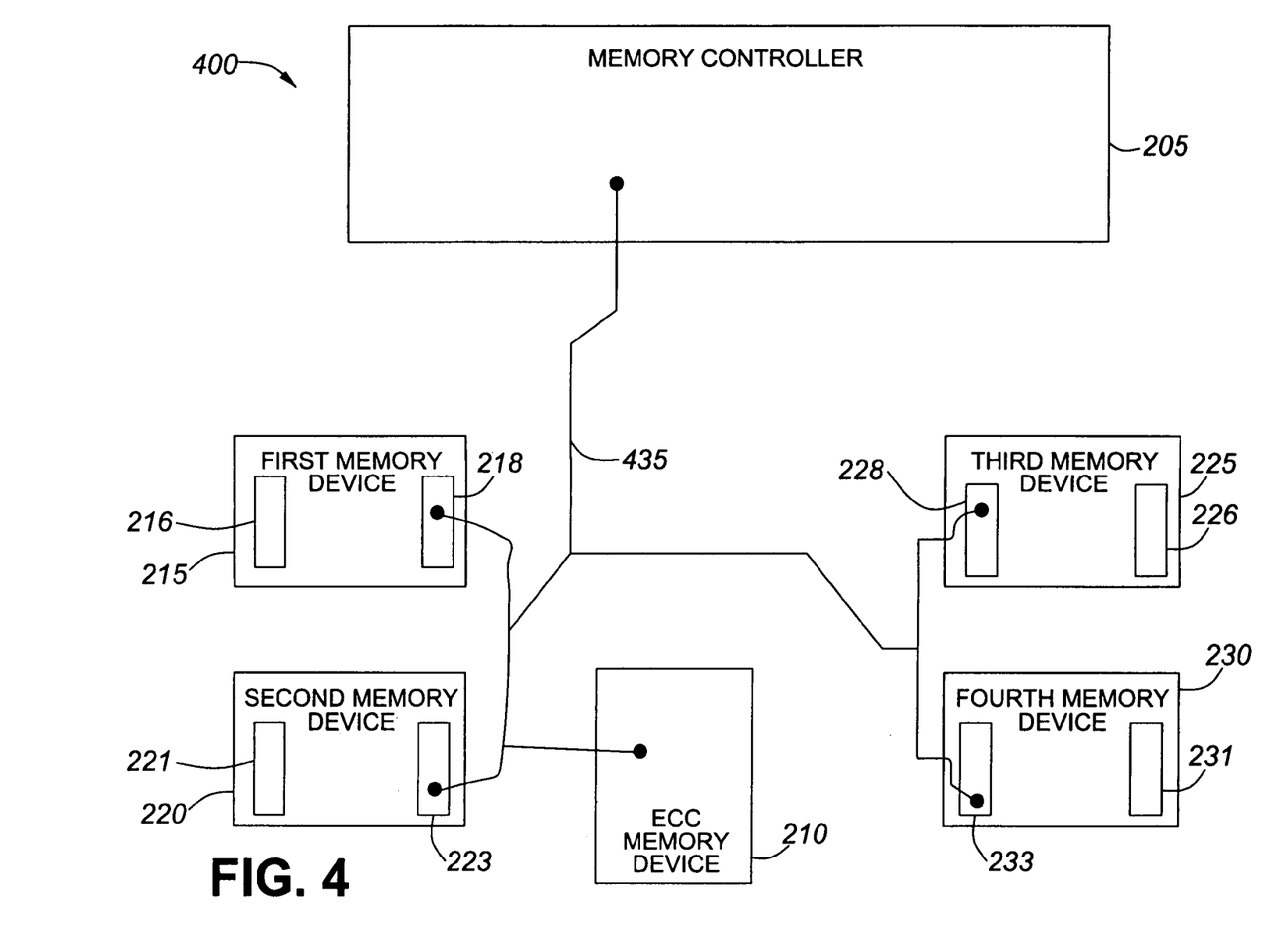
FIG. 4 is a schematic diagram of a fourth exemplary embodiment of a printed circuit board including four memory devices and an ECC memory device.

FIG. 4 is a schematic diagram of a fourth exemplary embodiment of a printed circuit board 400 including four memory devices 215, 220, 225, 230 and an ECC memory device 210. In various exemplary embodiments, exemplary printed circuit board 400 uses a branching tree formation for routing address/command line 435 to each memory device 210, 215, 220, 225, 230.

Thus, in various exemplary embodiments, address/command line 435 connects to an address/command line pin on the left side of the ECC memory device 210. Accordingly, to compensate for the additional length of the left sub-branch of address/command line 435, ECC memory device 210 is placed closer to first memory device 215 and second memory device 220 than to third memory device 225 and fourth memory device 230. Thus, in various exemplary embodiments, the amount of skew between the length of the sub-branch of address/command line 435 on the left side and right side is minimized, thereby providing better timing, balance, and signal integrity. It should be apparent that although ECC memory device 210 is placed close to the symmetrical center of printed circuit board 400 in FIG. 4, various exemplary embodiments place ECC memory device 210 in a different position depending on the amount of skew compensation required.

Figure 5:
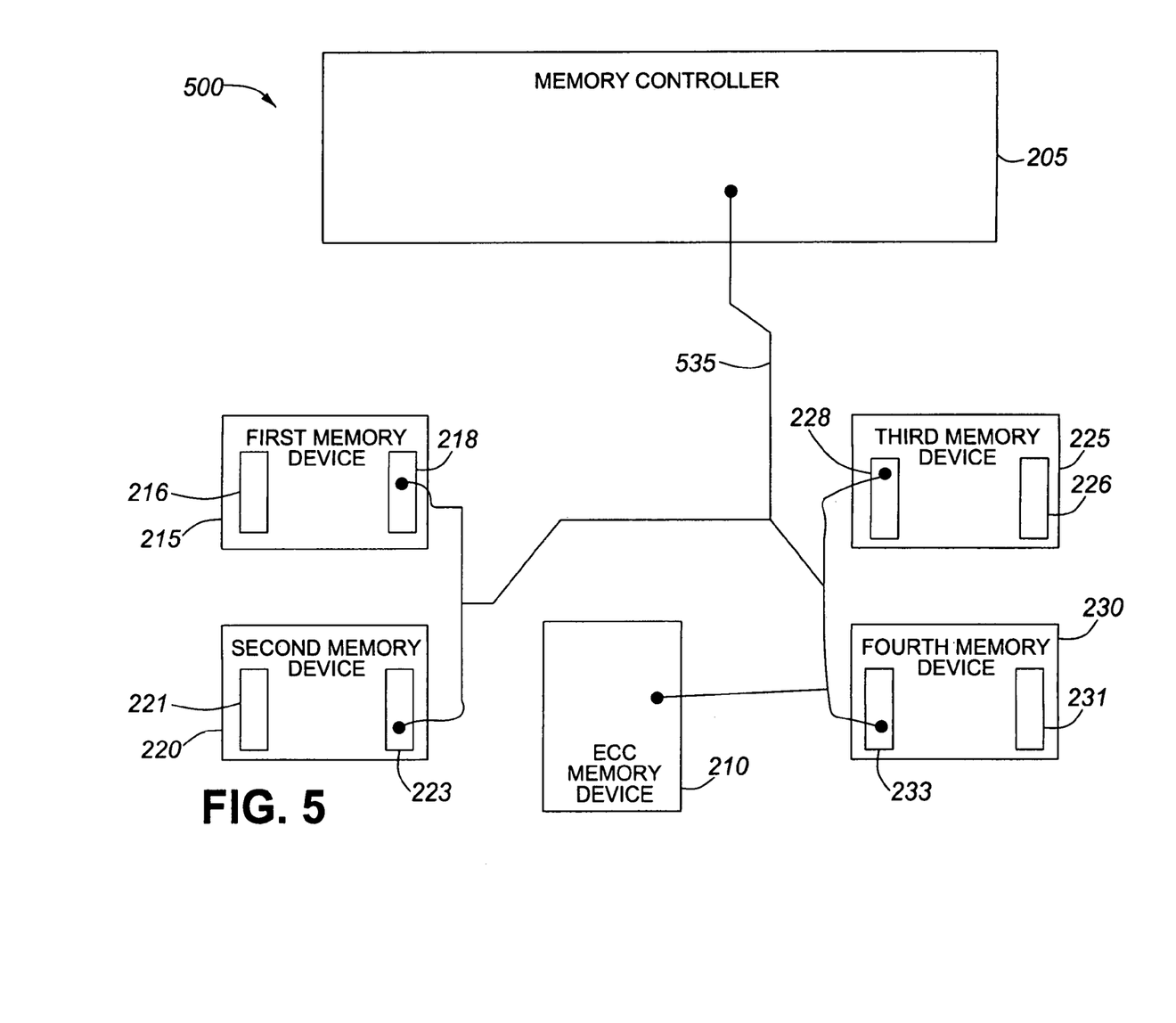
FIG. 5 is a schematic diagram of a fifth exemplary embodiment of a printed circuit board including four memory devices and an ECC memory device.

FIG. 5 is a schematic diagram of a fifth exemplary embodiment of a printed circuit board 500 including four memory devices 215, 220, 225, 230 and an ECC memory device 210. In various exemplary embodiments, exemplary printed circuit board 500 uses a branching tree formation for routing address/command line 535 to each memory device 210, 215, 220, 225, 230.

Thus, in various exemplary embodiments, address/command line 535 connects to an address/command line pin on the right side of the ECC memory device 210. Accordingly, to compensate for the additional length of the right sub-branch of address/command line 535, ECC memory device 210 is placed closer to third memory device 225 and fourth memory device 230 than to third memory device 215 and fourth memory device 220. Thus, in various exemplary embodiments, the amount of skew between the length of the sub-branch of address/command line 535 on the left side and right side is minimized, thereby providing better timing, balance, and signal integrity.

Figure 6:
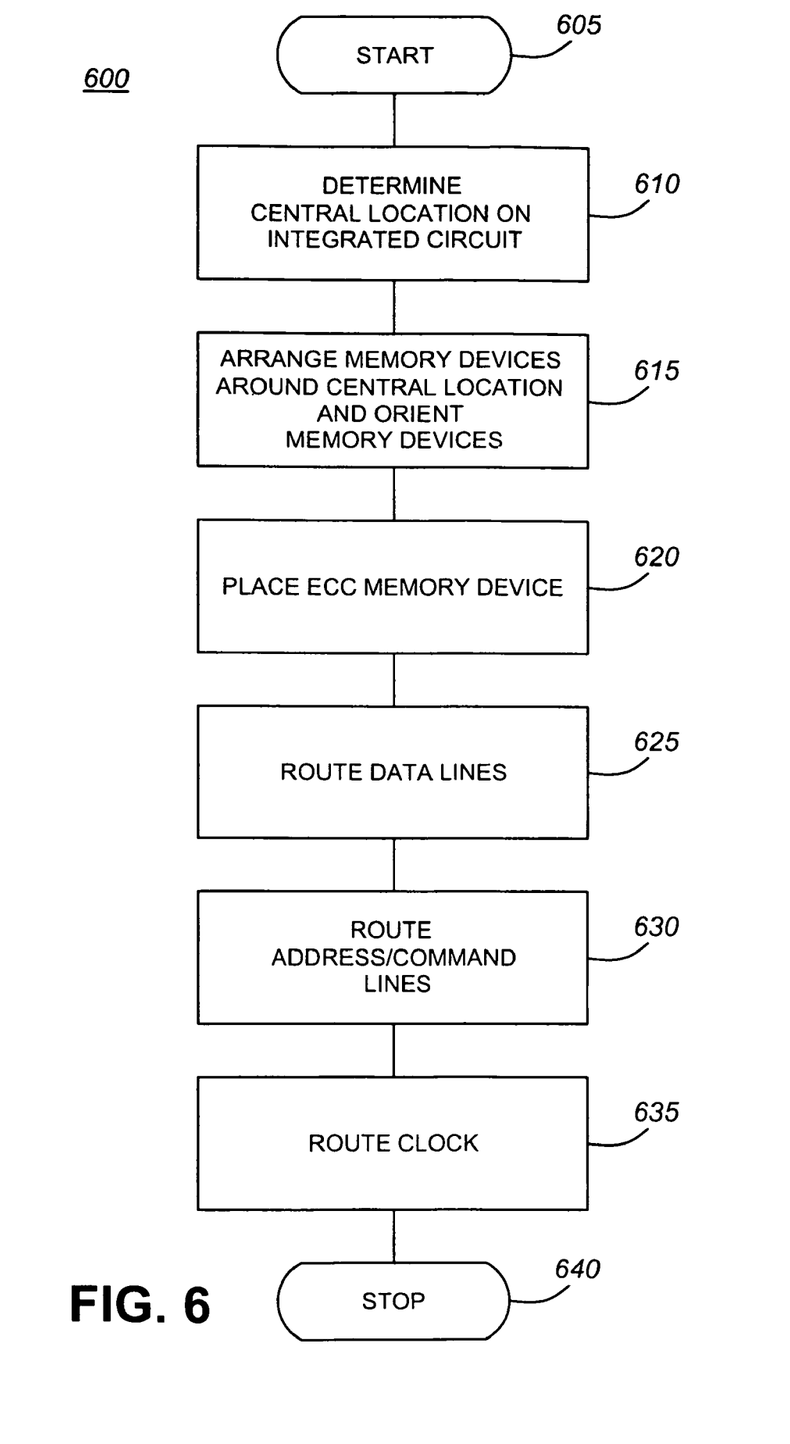
FIG. 6 is a flow chart of an exemplary embodiment of a method of manufacturing a printed circuit board including a memory controller.

FIG. 6 is a flow chart of an exemplary embodiment of a method 600 of manufacturing a printed circuit board including a memory controller. Exemplary method 600 starts in step 605 and proceeds to step 610, where a central location 250 on the printed circuit board 200, 300, 400, 500 is determined. In various exemplary embodiments, central location 250 is a point or area selected to minimize the difference between the length of the longest data line and the length of the shortest address/command line when a plurality of memory devices 210, 215, 220, 225, 230 are arranged around the central location 250.

After determining a central location 250 on the printed circuit board, exemplary method 600 proceeds to step 615, where the plurality of data memory devices 215, 220, 225, 230 are arranged around central location 250. In various exemplary embodiments, an equal number of memory devices are placed on each side of central location 250. Thus, in various exemplary embodiments, first memory device 215 and second memory device 220 are placed above or to the left of the central location 250, while third memory device 225 and fourth memory device 230 are placed below or to the right of the central location 250.

In addition, in step 615, the plurality of data memory devices 215, 220, 225, 230 are oriented such that the plurality of data pins 216, 221, 226, 231 are further from the memory controller 205 than the plurality of address/command pins 218, 223, 228, 233. Thus, in various exemplary embodiments, each of the plurality of memory devices 215, 220, 225, 230 is rotated ninety degrees, as described above in connection with FIG. 2.

After step 615, exemplary method 600 proceeds to step 620, where ECC memory device 210 is placed on the printed circuit board 200, 300, 400, 500. In various exemplary embodiments, ECC memory device 210 is placed in proximity of central location 250, such that ECC memory device 210 is closer to central location 250 than each of the plurality of data memory devices 215, 220, 225, 230. Furthermore, in various exemplary embodiments, when a branching tree routing method is used for address/command lines 235, 335, 435, 535, ECC memory device 210 is placed closer to the side from which ECC memory device 210 receives the address/command line 235, 335, 435, 535.

After placing the ECC memory device 210, exemplary method 600 proceeds to step 625, where data lines 240, 340, 440, 540 are routed to each of the data pins 216, 221, 226, 231. In various exemplary embodiments, some meandering is used for the shortest data line, such that the difference between the length of the shortest data line and the length of the longest data line is minimized.

Exemplary method 600 then proceeds to step 630, where address/command lines 235, 335, 435, 535 are routed to each of the address/command line pins 218, 223, 228, 233. In various exemplary embodiments, a branching tree method is used to route the address/command lines 235, 335, 435, 535, thereby minimizing delay when routing addresses and commands. In addition, in various exemplary embodiments, the address/command lines 235, 335, 435, 535 are routed through central location 250.

After routing address/command lines 235, 335, 435, 535, exemplary method 600 proceeds to step 635, where a clock line is routed to each of the plurality of data memory devices 210, 215, 220, 225, 230. Exemplary method 600 then proceeds to step 640, where exemplary method 600 stops.

Figure 7:
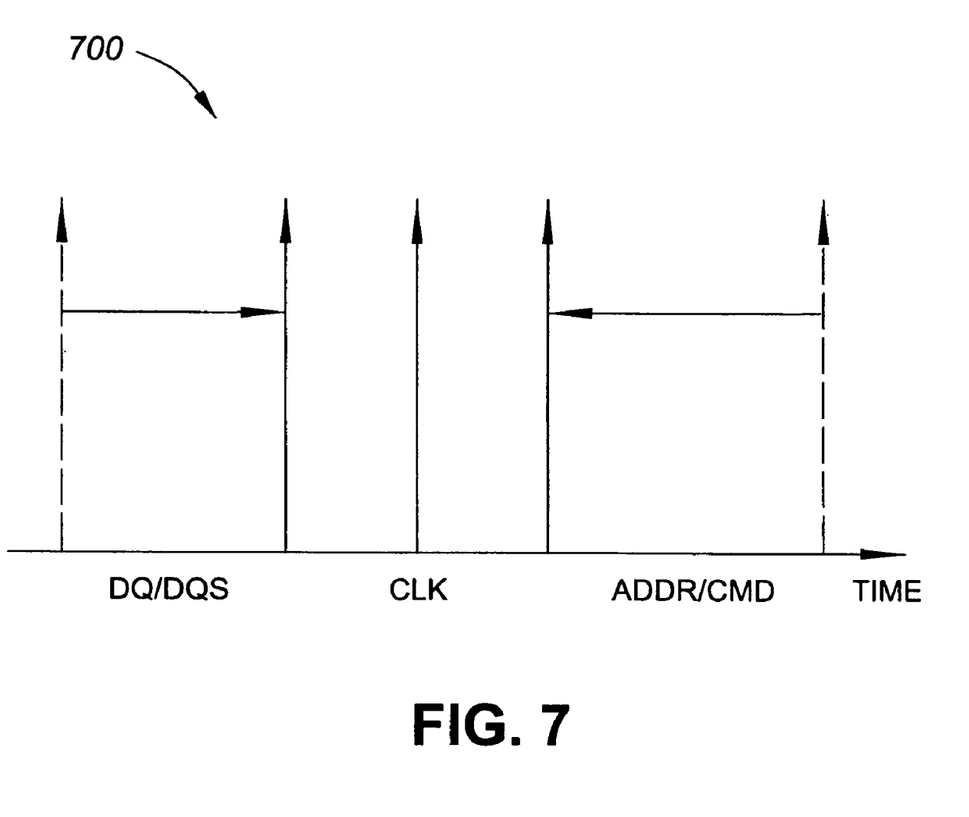
FIG. 7 is a diagram illustrating a timing improvement attained by implementing various exemplary embodiments of a printed circuit board.

FIG. 7 is a diagram illustrating a timing improvement attained by implementing various exemplary embodiments of a printed circuit board 200, 300, 400, 500. As illustrated, by implementing various exemplary embodiments described herein, the timing of data lines and data line strobes (DQ/DQs) is moved to the right, closer to the clock signal (CLK). Furthermore, the timing of address/command line signals is moved to the left, closer to the clock signal (CLK). Accordingly, in various exemplary embodiments, a timing margin is improved through placement and routing of lines, without requiring lengthening of DQ/DQs lines through meandering.

According to the forgoing, various exemplary embodiments reduce the amount of skew between data lines and address/command lines. Thus, various exemplary embodiments enable the use of a higher speed memory interface between a network processor or other memory controller and the individual memory devices, particularly when implementing ECC DDR2 memory devices. Moreover, various exemplary embodiments reduce the need for meandering, thereby saving routing layers and reducing the cost for printed circuit board fabrication. Accordingly, various exemplary embodiments improve system performance, while simultaneously decreasing printed circuit board manufacturing costs.

Although the various exemplary embodiments have been described in detail with particular reference to certain exemplary aspects thereof, it should be understood that the invention is capable of other different embodiments, and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only, and do not in any way limit the invention, which is defined only by the claims.

What is claimed is:

1. A printed circuit board, comprising:
   a memory controller;
   a plurality of synchronous data memory devices, each synchronous data memory device comprising at least one data pin and at least one address/command pin;
   an ECC memory device comprising at least one ECC data pin and at least one ECC address/command pin; and
   at least one surface, wherein:
   the plurality of synchronous data memory devices are arranged around a central location on the at least one surface,
   each synchronous data memory device is oriented such that the at least one data pin is further from the memory controller than the at least one address/command pin, and
   a long axis of each of the plurality of synchronous data memory devices forms an angle of ninety degrees with respect to a long axis of the ECC memory device.

2. The printed circuit board according to claim 1, further comprising:
   a plurality of data lines routed to the at least one data pin on each synchronous data memory device and to the at least one ECC data pin on the ECC memory device.

3. The printed circuit board according to claim 1, further comprising:
   a plurality of address/command lines routed to the at least one address/command pin on each synchronous data memory device and routed to the at least one ECC address/command pin on the ECC memory device.

4. The printed circuit board according to claim 3, wherein the plurality of address/command lines pass through the central location.

5. The printed circuit board according to claim 3, wherein the plurality of address/command lines are arranged in a branching tree formation.

6. The printed circuit board according to claim 5, wherein the ECC memory device is placed closest to a first synchronous memory device of the plurality of synchronous data memory devices that forwards the plurality of address/command lines to the ECC memory device.

7. The printed circuit board according to claim 1, wherein the ECC memory device is placed closer to the central location than each of the plurality of synchronous data memory devices.

8. The printed circuit board according to claim 1, wherein the plurality of synchronous data memory devices are arranged equidistant from the central location.

9. The printed circuit board according to claim 1, wherein the plurality of synchronous data memory devices are arranged symmetrically with respect to an axis, the axis passing through a midpoint of the memory controller.

10. The printed circuit board according to claim 1, wherein the plurality of synchronous data memory devices are arranged in a clamshell arrangement.

11. The printed circuit board according to claim 1, wherein the memory controller is a network processor.

12. The printed circuit board according to claim 1, wherein the plurality of synchronous data memory devices are double data rate memory devices.

13. A method of manufacturing a printed circuit board including a memory controller, the method comprising:
   determining a central location on a surface of the printed circuit board;
   arranging a plurality of synchronous data memory devices around the central location, each synchronous data memory device comprising at least one data pin and at least one address/command pin, wherein each synchronous data memory device is oriented such that the at least one data pin is further from the memory controller than the at least one address/command pin; and
   placing an ECC memory device proximate to the central location, the ECO memory device comprising at least one ECC data pin and at least one ECC address/command pin, wherein a long axis of each of the plurality of synchronous data memory devices forms an angle of ninety degrees with respect to a long axis of the ECC memory device.

14. The method of manufacturing a printed circuit board including a memory controller according to claim 13, further comprising:
routing a plurality of data lines to the at least one data pin on each synchronous data memory device; and
routing a plurality of data lines to the at least one ECC data pin on the ECC memory device.

15. The method of manufacturing a printed circuit board including a memory controller according to claim 13, further comprising:
routing a plurality of address/command lines to the at least one address/command pin on each synchronous data memory device; and
routing a plurality of address/command lines to the at least one ECC address/command pin on the ECC memory device.

16. The method of manufacturing a printed circuit board including a memory controller according to claim 15, wherein the plurality of address/command lines pass through the central location.

17. The method of manufacturing a printed circuit board including a memory controller according to claim 15, wherein the plurality of address/command lines are arranged in a branching tree formation.

18. The method of manufacturing a printed circuit board including a memory controller according to claim 17, wherein the ECC memory device is placed closest to a first synchronous data memory device of the plurality of synchronous data memory devices that forwards the plurality of address/command lines to the ECC memory device.

19. The method of manufacturing a printed circuit board including a memory controller according to claim 13, wherein the ECC memory device is placed closer to the central location than each of the plurality of synchronous data memory devices.

20. The method of manufacturing a printed circuit board including a memory controller according to claim 13, wherein the plurality of synchronous data memory devices are arranged equidistant from the central location.

21. The method of manufacturing a printed circuit board including a memory controller according to claim 13, wherein the plurality of synchronous data memory devices are arranged symmetrically with respect to an axis, the axis passing through a midpoint of the memory controller.

22. The method of manufacturing a printed circuit board including a memory controller according to claim 13, wherein the memory controller is a network processor.

23. The method of manufacturing a printed circuit board including a memory controller according to claim 13, wherein the plurality of synchronous data memory devices are double data rate memory devices.

24. A printed circuit board, comprising:
a memory controller;
a plurality of synchronous data memory devices, each synchronous data memory device comprising at least one data pin and at least one address/command pin;
an ECC memory device comprising at least one ECC data pin and at least one ECC address/command pin; and
at least one surface, wherein:
the plurality of synchronous data memory devices are arranged around a central location on the at least one surface,
each synchronous data memory device is oriented such that the at least one data pin is further from the memory controller than the at least one address/command pin, and
the plurality of synchronous data memory devices are arranged symmetrically with respect to an axis, the axis passing through a midpoint of the memory controller.

25. The printed circuit board according to claim 24, further comprising:
a plurality of data lines routed to the at least one data pin on each synchronous data memory device and to the at least one ECC data pin on the ECC memory device.

26. The printed circuit board according to claim 24, further comprising:
a plurality of address/command lines routed to the at least one address/command pin on each synchronous data memory device and routed to the at least one ECC address/command pin on the ECC memory device.

27. The printed circuit board according to claim 24, wherein the ECC memory device is placed closer to the central location than each of the plurality of synchronous data memory devices.

28. The printed circuit board according to claim 24, wherein the plurality of synchronous data memory devices are arranged equidistant from the central location.

29. The printed circuit board according to claim 24, wherein the plurality of synchronous data memory devices are arranged in a clamshell arrangement.

30. The printed circuit board according to claim 24, wherein the memory controller is a network processor.

31. A printed circuit board, comprising:
a memory controller;
a plurality of synchronous data memory devices, wherein the plurality of synchronous data memory devices are double data rate memory devices, each synchronous data memory device comprising at least one data pin and at least one address/command pin;
an ECC memory device comprising at least one ECC data pin and at least one ECC address/command pin; and
at least one surface, wherein the plurality of synchronous data memory devices are arranged around a central location on the at least one surface, and each synchronous data memory device is oriented such that the at least one data pin is further from the memory controller than the at least one address/command pin.

32. The printed circuit board according to claim 31, further comprising:
a plurality of data lines routed to the at least one data pin on each synchronous data memory device and to the at least one ECC data pin on the ECC memory device.

33. The printed circuit board according to claim 31, further comprising:
a plurality of address/command lines routed to the at least one address/command pin on each synchronous data memory device and routed to the at least one ECC address/command pin on the ECC memory device.

34. The printed circuit board according to claim 31, wherein the ECC memory device is placed closer to the central location than each of the plurality of synchronous data memory devices.

35. The printed circuit board according to claim 31, wherein the plurality of synchronous data memory devices are arranged equidistant from the central location.

36. The printed circuit board according to claim 31, wherein the plurality of synchronous data memory devices are arranged in a clamshell arrangement.

37. The printed circuit board according to claim 31, wherein the memory controller is a network processor.

* * * * *

UNITED STATES PATENT AND TRADEMARK OFFICE
CERTIFICATE OF CORRECTION

PATENT NO. : 7,697,332 B2  Page 1 of 1
APPLICATION NO. : 12/000489
DATED : April 13, 2010
INVENTOR(S) : Pingyu Qu and Barrie Patrick Gahan It is certified that error appears in the above-identified patent and that said Letters Patent is hereby corrected as shown below:

Column 8, Claim 13, line 13, change "ECO" to "ECC"

Signed and Sealed this

Twenty-fifth Day of May, 2010

David J. Kappos
*Director of the United States Patent and Trademark Office*